(12) United States Patent
Fain et al.

(10) Patent No.: US 7,508,212 B2
(45) Date of Patent: Mar. 24, 2009

(54) RF COIL ASSEMBLY AND METHOD FOR PRACTICING MAGNETIZATION TRANSFER ON MAGNETIC RESONANCE IMAGING AND SPECTROSCOPY SYSTEMS

(75) Inventors: Sean B. Fain, Madison, WI (US); Matthew G. Erickson, Madison, WI (US); Krishna N. Kurpad, Madison, WI (US); James H. Holmes, Madison, WI (US); Thomas M. Grist, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/841,201

(22) Filed: Aug. 20, 2007

(65) Prior Publication Data

US 2008/0231281 A1    Sep. 25, 2008

Related U.S. Application Data

(63) Continuation-in-part of application No. 11/726,643, filed on Mar. 22, 2007.

(51) Int. Cl.
G01V 3/00 (2006.01)
(52) U.S. Cl. .................. 324/318; 324/322
(58) Field of Classification Search ........... 324/318, 324/322
See application file for complete search history.

(56) References Cited

U.S. PATENT DOCUMENTS

| 4,680,548 A | 7/1987 | Edelstein et al. |
|---|---|---|
| 4,686,473 A | 8/1987 | Chesneau et al. |
| 4,692,705 A | 9/1987 | Hayes |
| 4,694,255 A | 9/1987 | Hayes |
| 4,746,866 A | 5/1988 | Roschmann |
| 4,751,464 A | 6/1988 | Bridges |
| 4,755,756 A | 7/1988 | Nishihara et al. |
| 4,799,016 A | 1/1989 | Rezvani |
| 4,859,950 A | 8/1989 | Keren |

(Continued)

FOREIGN PATENT DOCUMENTS

| EP | 0239147 A1 | 9/1987 |
|---|---|---|
| EP | 0454370 A2 | 10/1991 |

OTHER PUBLICATIONS

Zhang X et al., "A circular-polarized double-tuned (31P and 1H) TEM coil for human head MRK/MRS at 7T", Proceedings of the International Society for Magnetic Resonance in Medicine, Scientific Meeting and Exhibition, Jul. 10-16, 2003, Toronto, Canada.
Avdievich Ni, Hetherington HH: 4T actively-detunable double-tuned 1H/31P TEM head volume coil and four-channel 31P phased array for human brain spectroscopy; Proceedings of the Society for Magnetic Resonance in Medicine, 14th Scientific Meeting and Exhibition, Seattle, Washington, May 6-12, 2006.

(Continued)

*Primary Examiner*—Louis M Arana
(74) *Attorney, Agent, or Firm*—Quarles & Brady

(57) ABSTRACT

An RF coil assembly for an MRI system includes a resonator formed by a cylindrical shield and pairs of opposing conductive legs disposed symmetrically around a central axis and extending the axial length of the shield. One set of conductive leg pairs is tuned to operate at the Larmor frequency of $^{13}C$ and another set is tuned to operate at the Larmor frequency of $^{1}H$. Drive circuitry operates the RF coil assembly to produce $^{1}H$ spin magnetization which is transferred to $^{13}C$ magnetization by the nuclear overhauser effect and to acquire MR data from the $^{13}C$ spins. Multinuclear measurements can be made simultaneously at different Larmor frequencies.

10 Claims, 11 Drawing Sheets

U.S. PATENT DOCUMENTS

| | | | |
|---|---|---|---|
| 4,885,539 A | | 12/1989 | Roemer et al. |
| 4,887,039 A | | 12/1989 | Roemer et al. |
| 4,922,204 A | | 5/1990 | Duerr et al. |
| 4,952,879 A | | 8/1990 | Van Vaals et al. |
| 5,053,711 A | * | 10/1991 | Hayes et al. ................. 324/318 |
| 5,057,778 A | * | 10/1991 | Rath .......................... 324/322 |
| 5,296,814 A | | 3/1994 | Lyle |
| 5,365,173 A | * | 11/1994 | Zou et al. .................... 324/318 |
| 5,402,785 A | | 4/1995 | Leigh et al. |
| 5,412,322 A | * | 5/1995 | Wollin ........................ 324/318 |
| 5,557,247 A | | 9/1996 | Vaughn, Jr. |
| 5,680,046 A | | 10/1997 | Frederick et al. |
| 5,929,639 A | * | 7/1999 | Doty .......................... 324/318 |
| 5,990,681 A | | 11/1999 | Richard et al. |
| 6,236,206 B1 | | 5/2001 | Hartman et al. |
| 6,313,631 B1 | | 11/2001 | Fiat et al. |
| 6,320,385 B1 | | 11/2001 | Burl et al. |
| 6,344,745 B1 | | 2/2002 | Reisker et al. |
| 6,377,044 B1 | | 4/2002 | Burl et al. |
| 6,396,271 B1 | | 5/2002 | Burl et al. |
| 6,538,441 B1 | | 3/2003 | Watkins et al. |
| 6,559,642 B2 | | 5/2003 | King |
| 6,590,392 B2 | | 7/2003 | Boskamp et al. |
| 6,593,144 B2 | | 7/2003 | Albert et al. |
| 6,593,743 B2 | | 7/2003 | de Swiet et al. |
| 6,618,610 B2 | | 9/2003 | Nabetani |
| 6,822,448 B2 | | 11/2004 | Watkins et al. |
| 6,906,518 B2 | | 6/2005 | Leussler |
| 6,915,151 B2 | | 7/2005 | Baumgardner et al. |
| 7,019,527 B2 | | 3/2006 | Kleihorst et al. |
| 7,268,554 B2 | * | 9/2007 | Vaughan ..................... 324/322 |
| 7,292,038 B2 | * | 11/2007 | Doty .......................... 324/318 |
| 2003/0184293 A1 | | 10/2003 | Boskamp et al. |
| 2005/0242816 A1 | | 11/2005 | Kurpad et al. |
| 2006/0012370 A1 | | 1/2006 | Barberi |
| 2007/0279061 A1 | * | 12/2007 | Erickson et al. .............. 324/322 |

OTHER PUBLICATIONS

Erickson MG, Kurpad KN, Grist TM: "A van Vaals resonator with a novel quadrature drive circuit", Proceedings of the Society for Magnetic Resonance in Medicine, 14th Scientific Meeting and Exhibition, Seattle, Washington, May 6-12, 2006.

Zhang X et al., "A dual-tuned microstrip volume coil array for human head parallel 1H/31P MRI/MRS at 7T", Proceedings of the Society for Magnetic Resonance in Medicine, Scientific Meeting and Exhibition, Miami Beach, Florida, May 7-13, 2005.

D.W.J. Klomp, W.K.J.Renema; M. van der Graaf; B.E. de Galan, A.P.M. Kentgens, A. Heerschap, "Sensitivity-Enhanced CMR Spectroscopy of the Human Brain at 3 Tesla", Magnetic Resonance in Medicine, published on line Dec. 21, 2005 by Wiley-Liss, Inc.

Jan H. Ardenkjaer-Larsen, Bjorn Fridlund, Andreas Gram, Georg Hansson, Lennart Hansson, Mathilde L. Lerche, Rolf Servin, Mikkel Thaning, Klaes Golman, "Increase in signal-to-noise radio of less than 10,000 times in liquid-state NMR", Amersham Health Research & Development, Malmo, Sweden, PNAS, Sep. 2, 2003, vol. 100, No. 18.

Klaes Golman, Ph.D., J. Stefan Petersson, Ph.D., "Metabolic Imaging and Other Applications of Hyperpolarized 13C1", Malmo, Sweden, Acad Radiol 2006, 13:932-942.

* cited by examiner

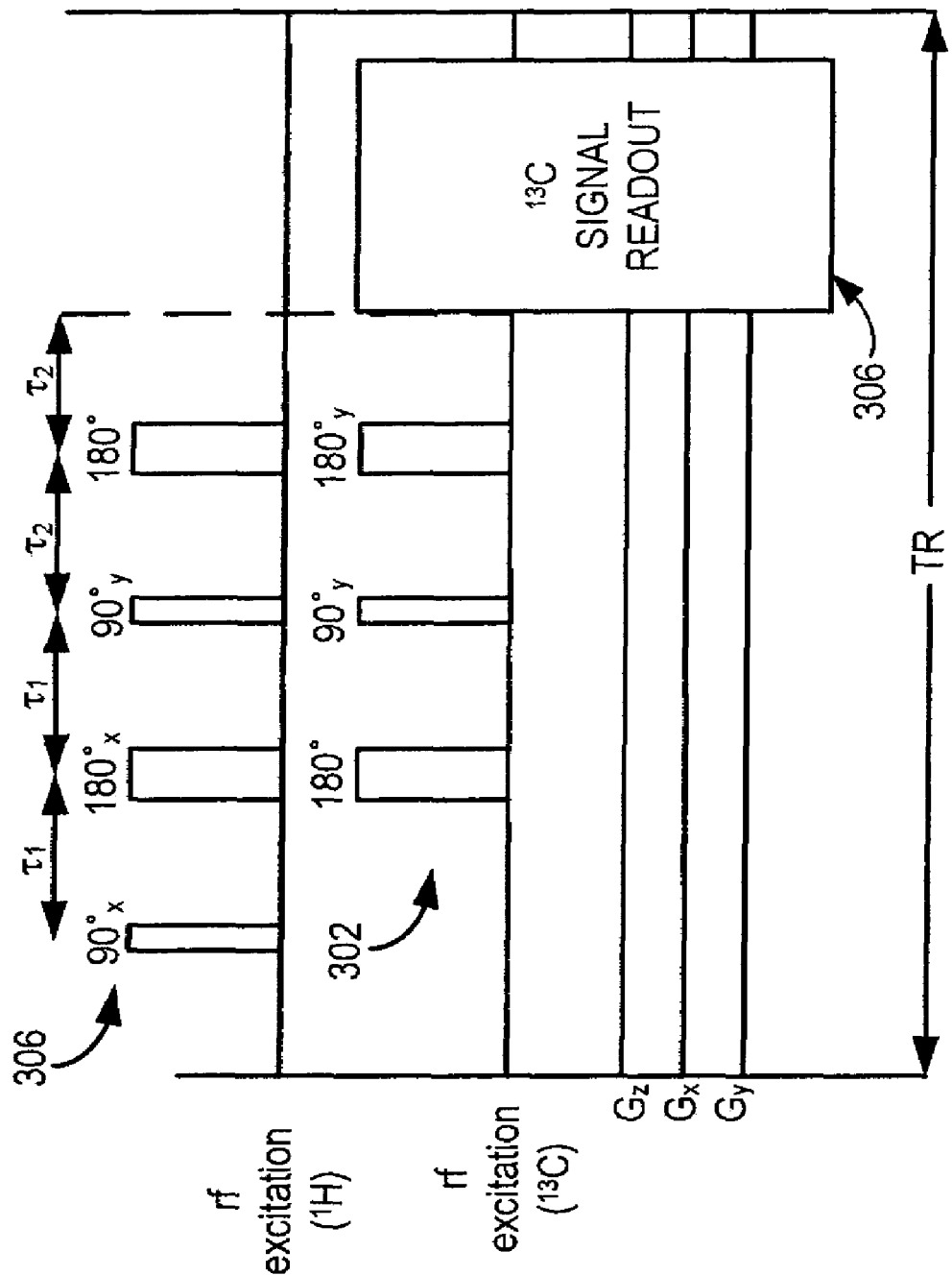

RF COIL ASSEMBLY AND METHOD FOR PRACTICING MAGNETIZATION TRANSFER ON MAGNETIC RESONANCE IMAGING AND SPECTROSCOPY SYSTEMS

CROSS REFERENCE TO RELATED APPLICATIONS

This application is a continuation-in-part of U.S. patent application Ser. No. 11/726,643, filed Mar. 22, 2007, and titled "RF Coil Assembly for Magnetic Resonance Imaging and Spectroscopy Systems", which is hereby incorporated by reference.

STATEMENT REGARDING FEDERALLY FUNDED RESEARCH

This invention was made with United States government support awarded by the following agency: NIH grants: HL069116 and HL066488. The United States has certain rights in this invention.

FIELD OF THE INVENTION

The field of the invention is nuclear magnetic resonance imaging (MRI) and spectroscopy (MRS) methods and systems. More particularly, the invention relates to coils used to apply radio frequency (RF) magnetic fields in magnetization transfer scans and to receive NMR signals produced in response.

BACKGROUND OF THE INVENTION

When a substance such as human tissue is subjected to a uniform magnetic field (polarizing field $B_0$) applied along the z axis of a Cartesian coordinate system, the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment $M_t$. A NMR signal is emitted by the excited spins after the excitation signal $B_1$ is terminated, this signal may be received and processed to form an image or produce a spectrum.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Radio frequency antennas, or coils are used to produce the excitation field $B_1$ and other RF magnetic fields in the subject being examined. Such coils are also used to receive the very weak NMR signals that are produced in the subject. Such coils may be so-called "whole body" coils that are large enough to produce a uniform magnetic field for a human subject or, they can be much smaller "local" coils that are designed for specific clinical applications such as head imaging, knee imaging, wrist imaging, etc. Local coils may be either volume coils or surface coils.

The most common whole body coil found in commercial MRI systems is the so-called "birdcage" coil first disclosed in U.S. Pat. Nos. 4,692,705; 4,694,255; and 4,680,548. A birdcage coil has a pair of circular end rings which are bridged by a plurality (typically 8 to 24) of equi-spaced longitudinal straight segments. In a primary mode, currents in the straight segments are sinusoidally distributed which results in good $B_1$ field uniformity across the axis of the coil. Birdcage coils are the structure of choice in horizontal field MRI systems because they produce a homogeneous magnetic $B_1$ field in the bore of the magnet. When properly designed and constructed, they have a high SNR which enables them to pick up the small NMR signals emanating from the subject under examination.

The birdcage coil is tuned by proper selection of capacitors which are distributed along the lengths of the straight segments, distributed around each end ring or both. Matching and tuning are commonly achieved by connecting variable capacitors in an "L" configuration at the drive ports. Birdcage coils are typically driven at one, two, or more recently, four ports. Multi-port drive, where each drive source is appropriately phased, ensures uniform, circularly polarized $B_1$ fields in the imaging volume at $B_0$ field strengths of 1.5 T or less. Efforts to improve the tunability of birdcage coils either provide fewer capacitor adjustments that distort the homogeneity of the B1 field or provide expensive and complex tuning structures such as those described in U.S. Pat. Nos. 6,396,271 and 6,236,206.

There are a number of clinical applications where MR images are acquired at different Larmor frequencies. Hydrogen ($H^1$) is the spin species of choice for most MR imaging applications, but other paramagnetic spin species such as phosphorus ($^{31}P$), fluorine ($^{19}F$), carbon ($^{13}C$), sodium ($^{23}Na$), helium ($^3He$) and xenon ($^{129}Xe$) are also employed. Most of these alternative spin species are of interest in MR spectroscopy, but the use of helium for imaging the lung and carbon-13 metabolites in cancer, for example, have significant clinical potential. As indicated above, the birdcage coil is difficult to tune at more than one Larmor frequency and the substantial change in Larmor frequency required to examine these alternative spin species is not practical.

Multinuclear excitation and reception coils have been proposed. In U.S. Pat. No. 4,799,016 for example, two birdcage coils are formed on one cylindrical substrate, with one coil tuned to hydrogen ($^1H$) and the other tuned to phosphorus ($^{13}P$). To reduce interaction between the coils, the fields they produce are offset 90° in phase. In U.S. Pat. No. 5,990,681 an RF coil is described which has an adjustment end ring provided on the end of a birdcage coil, wherein the ring can be rotated to change its Larmor frequency. An important limitation of prior multinuclear coils is that they consist of multi-modal resonant structures such as birdcage or TEM volume resonators. If one of the resonant modes corresponding to the Larmor frequency of the first nucleus coincides with the fundamental resonant mode corresponding to the Larmor frequency of the second nucleus, the isolation between the two components of the multi-nuclear coil degrades, and the two components of the coil cannot be operated simultaneously. In addition, poor isolation tends to degrade efficiency for each component of the coil in question. In practice, this means that when an image of a subject is acquired at the Larmor frequency of one nucleus, a subsequent scan must be performed if an image is to be obtained at the Larmor frequency of the second nucleus. During the time interval between scans, subject motion may occur, making the co-registration of the two scans difficult. It is therefore desirable to design multi-nuclear coils wherein the component coils are not multi-modal in nature, and the component coils have good electrical isolation and nearly identical spatial profiles.

The in vivo MRS of nuclei other than $^1H$ provides valuable information about metabolism, and the study of intermediary metabolism of biomolecules provides insight into disease processes. A $^{13}C$ contrast agent or a $^{31}P$ contrast agent, for example, may be administered and an MRS acquisition performed to indicate where these agents are used in the subject under examination. Since the MRS images do not reveal the anatomic structures of the subject, it is common practice to also acquire a conventional $^1H$ image and overlay the MRS image to reveal where in the anatomy the MRS signals are emanating.

The MR signal produced by spin species such as $^{13}C$ is much lower than that obtained for $^1H$ and the SNR of the resulting MRS image is low. The SNR may be expressed as:

$$SNR \propto \gamma PC = \gamma^2 B_0 C$$

where $\gamma$ is the gyromagnetic ratio of the nuclei in question, P is the polarization and C is the concentration of the signal generating nuclei. At body temperature the polarization (P) of $^{13}C$ is only about one-fourth that of $^1H$ and its concentration C is also much lower. To overcome this SNR disadvantage, methods have been developed as described by Ardenkjaer-Larsen et al., "Increase in Signal-to-Noise Ratio of >10,000 Times in Liquid-State NMR," PNAS, Sep. 2, 2003, Vol. 100, No. 18, to hyperpolarize the $^{13}C$ nuclei prior to administration to the subject. Such hyperpolarization can significantly increase the SNR of the MRS image, however, the half life of the hyperpolarized $^{13}C$ is only 7 to 40 seconds. This requires prompt scanning after administration of the $^{13}C$ contrast agent.

Another difficulty in acquiring $^{13}C$ MR signals is that the signals are split due to J-coupling with $^1H$ spins. This J-coupling reduces sensitivity and spectral resolution. However, the J-coupling can be used to advantage if the $^1H$ spins are saturated by application of RF energy at their Larmor frequency over a bandwidth of approximately 5 ppm. Through the Nuclear Overhauser Effect (NOE), not only is the split up of the $^{13}C$ MR signal corrected to increase SNR, but the magnetization $M_z$ of $^{13}C$ is increased by the transfer of magnetization from $^1H$ due to their coupling. The trick is to saturate $^1H$ spins at their Larmor frequency and both excite and readout MR signals at the $^{13}C$ Larmor frequency during the same scan. Inadequate isolation between resonant modes prevents simultaneous operation of conventional multi-nuclear coil designs, which decreases the efficiency of spin exchange in the NOE experiment, particularly at high field strengths (e.g. 3 Tesla) where SAR limitations also occur. Moreover it is often the case that transmit coils for saturating $^1H$ spins have a very different spatial sensitivity than the receive coils used for reading out the $^{13}C$ signal. This leads to spatially variable saturation and magnetization transfer that is undesirable for quantitative imaging applications.

SUMMARY OF THE INVENTION

The present invention is an MRI system which acquires an MRS image of one spin species using magnetization transfer from another spin species having a different Larmor frequency. More particularly, the MRI system includes a resonator having a cylindrical shield formed around a central axis and having plurality of pairs of opposing conductive legs arranged symmetrically around the central axis with the pairs of opposing conductive legs being divided into a first set and a second set, each conductive leg extending from one end of the cylindrical shield to another end of the cylindrical shield. Each set includes: means for tuning each conductive leg in the first set to the Larmor frequency of a first spin species, means for tuning each conductive leg in the second set to the Larmor frequency of a second spin species, first drive circuitry connected to each pair of opposing conductive legs in the first set and being operable to establish substantially equal and opposite current flow in opposing conductive legs at the Larmor frequency of the first spin species, second drive circuitry connected to each pair of opposing conductive legs in the second set and being operable to establish substantially equal and opposite current flow in opposing conductive legs at the Larmor frequency of the second spin species; and means for directing the first drive circuit to saturate the first spin species and thereby transfer magnetization to the second spin species and for directing the second drive circuit to excite the second spin species and acquire an MR signal from the same.

A general object of the invention is to enable magnetization transfer from one spin species to another while acquiring an MR signal from the other spin species. This is achieved by using one set of opposing conductive legs and associated drive circuitry to saturate the one spin species at its Larmor frequency and by using the other set of opposing conductive legs and associated drive circuitry to excite the other spin species and acquire the resulting MR signals therefrom. The excitation volumes are the same for both sets of opposing conductive legs and mutual coupling is minimal.

Another aspect of the invention is a coil assembly that can operate at multiple Larmor frequencies simultaneously during a magnetization transfer acquisition. This multi-nuclear capability is possible by providing multiple resonators having separate pairs of conductive legs within the same cylindrical shield and enclosing the same imaging volume. Separate drive circuits are provided for the separate pairs of conductive legs that are operated at different Larmor frequencies. The terminal susceptance elements associated with a pair of conductive legs are optimized for the Larmor frequency of one nucleus while also effecting a voltage antinode, or high impedance at the Larmor frequency of the other nucleus. Thus, in selected cases of dual nuclear capability, the two channels can be well isolated from each other and enable them to be used simultaneously.

BRIEF DESCRIPTION OF THE DRAWINGS

FIG. 12 is a graphic representation of a preferred pulse sequence used to direct the operation of the coil assembly of FIG. 3.

DESCRIPTION OF THE PREFERRED EMBODIMENT

Figure 1:
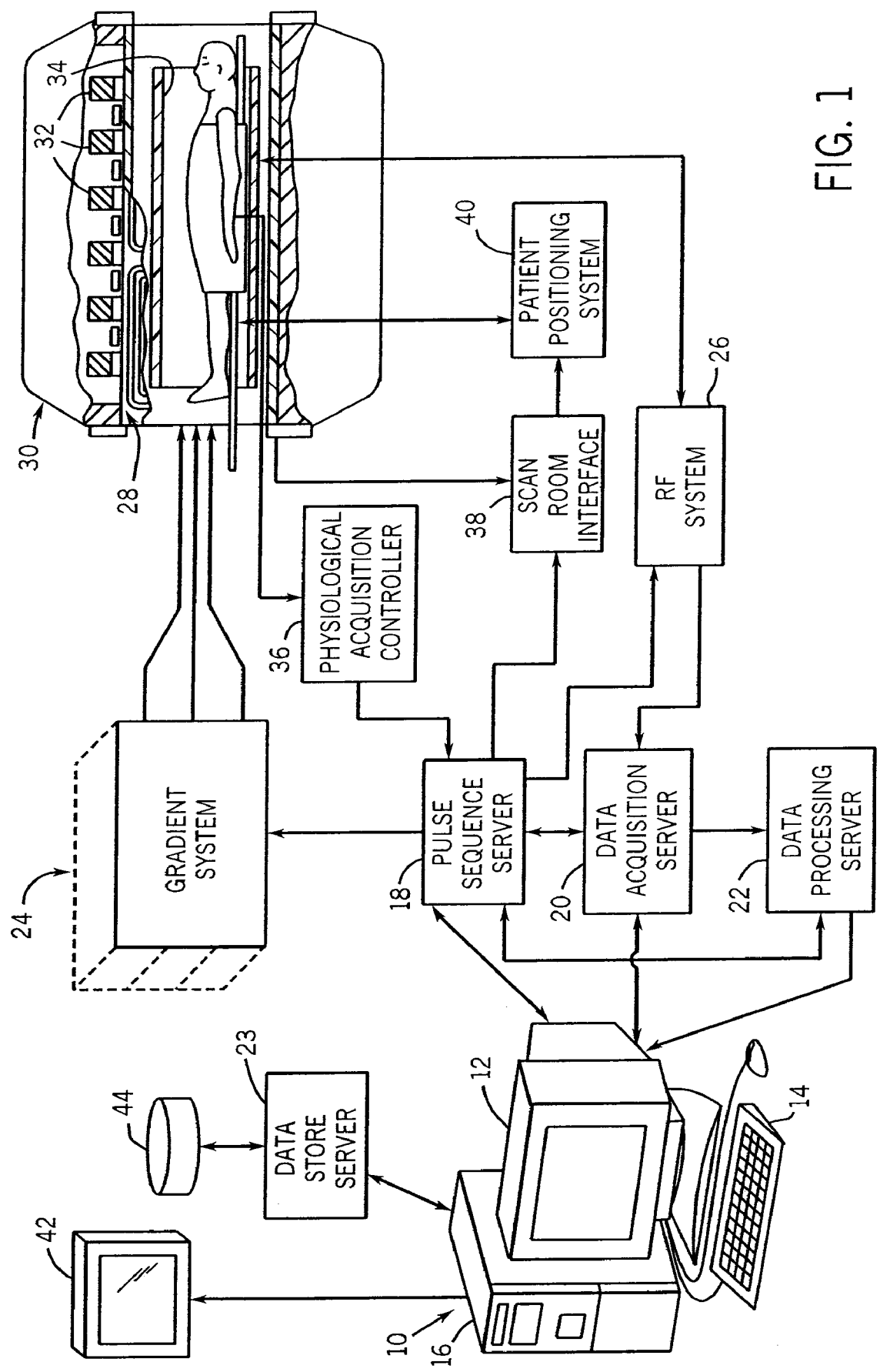
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34 made in accordance with the teachings of the present invention.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the RF coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
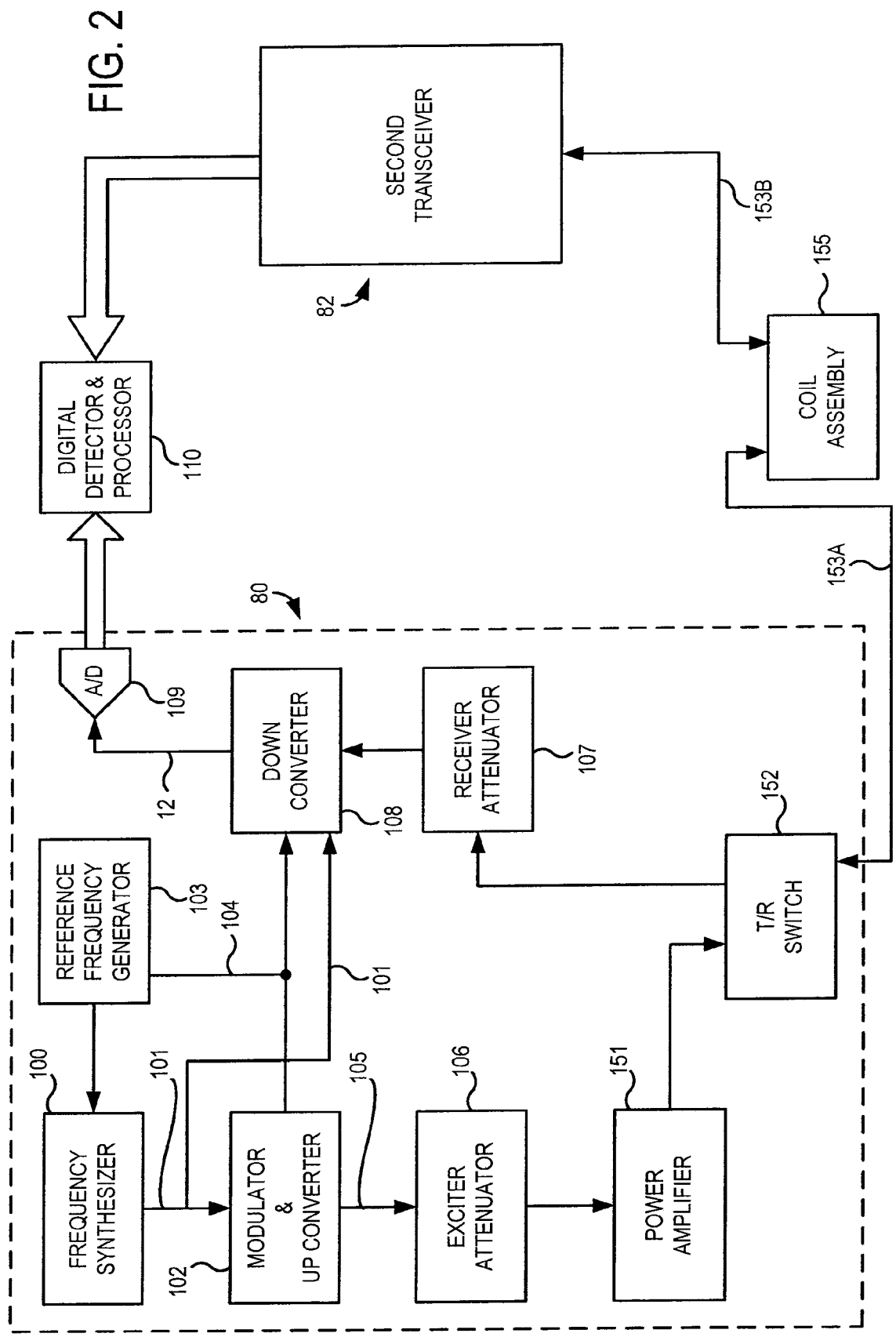
FIG. 2 is a block diagram of the RF system that forms part of the MRI system of FIG. 1.

Referring particularly to FIG. 2, the RF system 26 includes two transceivers indicated at 80 and 82. The transceivers are substantially identical in construction, except the transceiver 80 is tuned to the Larmor frequency of hydrogen protons ($^1H$) and the second transceiver 82 is tuned to the Larmor frequency of carbon ($^{13}C$). The following is a discussion of the transceiver 80, but it also applies to the second transceiver 82. The base, or carrier, frequency of an RF excitation field is produced by the transceiver 80 under control of a frequency synthesizer 100 which receives a set of digital signals from the pulse sequence server 18. These digital signals indicate the frequency and phase of the RF carrier signal produced at an output 101. The RF carrier signal is applied to a modulator and up converter 102 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 105 is attenuated by an exciter attenuator circuit 106 which receives a digital command from the pulse sequence server 18. The attenuated RF excitation pulses are applied to the power amplifier 151 that drives an RF coil assembly 155, through a transmit/receive (T/R) switch 152. For a more detailed description of this transmitter section reference is made to U.S. Pat. No. 4,952,877 which is incorporated herein by reference.

Referring still to FIG. 2, the NMR signal produced by the subject is picked up by the coil assembly 155 and applied through the transmit/receive switch 152 to a receiver channel. Although FIG. 2 illustrates a single receiver channel, in other embodiments, the transceiver 80 can include multiple receiver channels. The NMR signals are applied to a receiver preamplifier and attenuator 107 which amplifies the NMR signal by an amount determined by a digital attenuation signal received from the pulse sequence server 18. The received NMR signal is at or around the Larmor frequency, and this high frequency signal is down converted in a two step process by a down converter 108 which first mixes the NMR signal with the carrier signal on line 101 and then mixes the resulting difference signal with a reference signal on line 104. The down converted NMR signal is applied to the input of an analog-to-digital (A/D) converter 109 which samples and digitizes the analog signal and applies it to a digital detector and signal processor 110 which produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 109 are produced by a reference frequency generator 103. For a more detailed description of the receiver, reference is made to U.S. Pat. No. 4,992,736 which is incorporated herein by reference.

The transmit/receive switch 152 is used when the RF coil assembly is employed to both produce the uniform $B_1$ field and receive the resulting NMR signals. It is operated by the pulse sequence server 18 to switch to the transmitter during parts of the pulse sequence in which RF fields are to be produced at the $^1H$ Larmor frequency, and to switch connection to the receiver when NMR data is to be acquired. The connecting line 153A between the transmit/receive switch 152 and the coil assembly 155 is preferably a 50 ohm coaxial cable such as RG-213 Mil Spec or Andrews FSJ-50.

As indicated above, the second transceiver 82 is substantially the same as the transceiver 80 except it operates at the Larmor frequency of $^{13}C$. it can produce an RF excitation signal that is applied to the coil assembly 155 through a cable 153B, and it can receive NMR signals from the coil assembly 155 through cable 153B. The received NMR signals are down converted, digitized and output to the digital detector and processor 110 as described above. An important aspect of this system is that the two transceivers 80 and 82 can be operated simultaneously to excite and receive NMR signals from both $^1H$ and $^{13}C$ spins.

Figure 3:
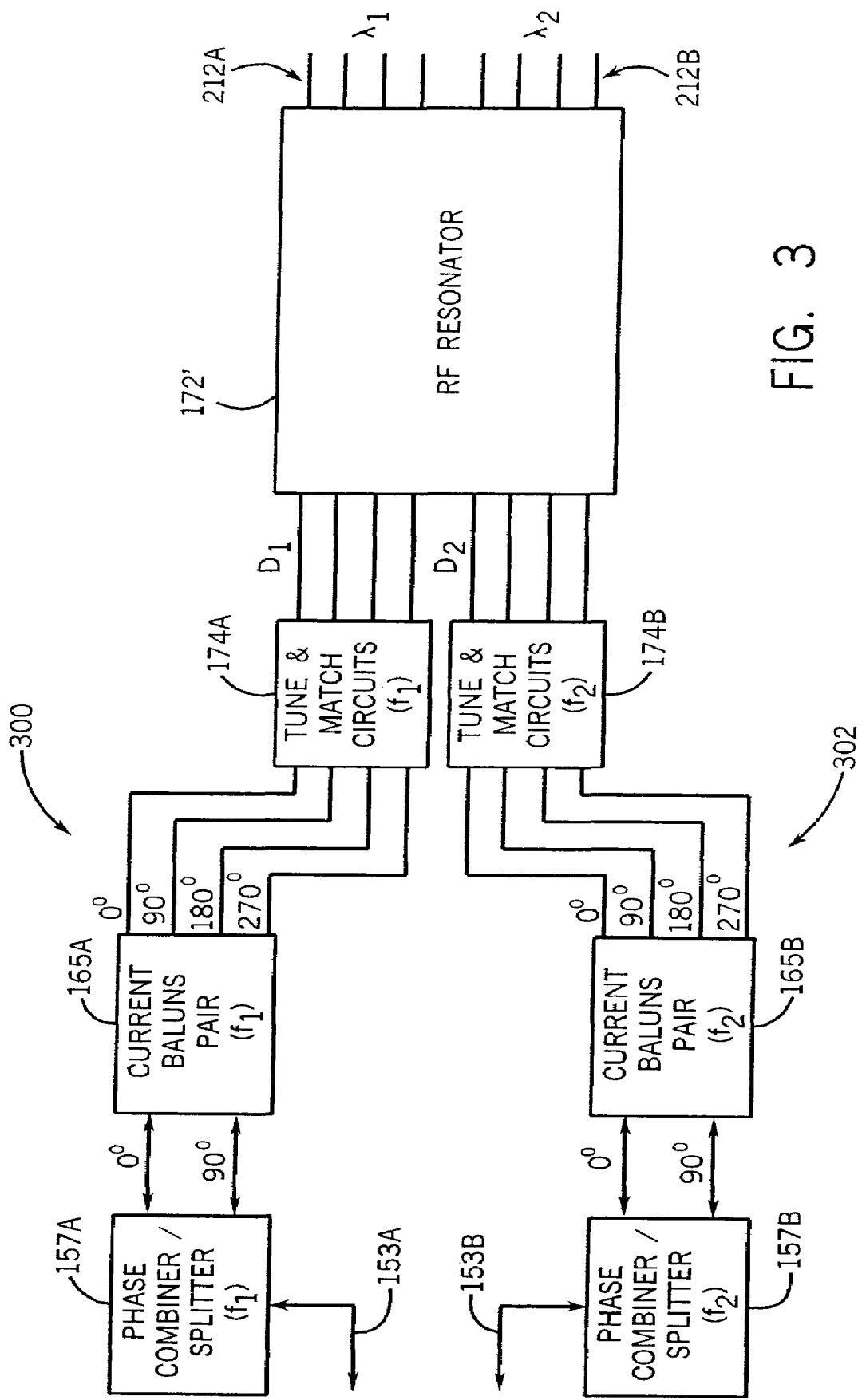
FIG. 3 is a block diagram of a first preferred embodiment of the coil assembly that forms part of FIG. 2.
Figure 4:
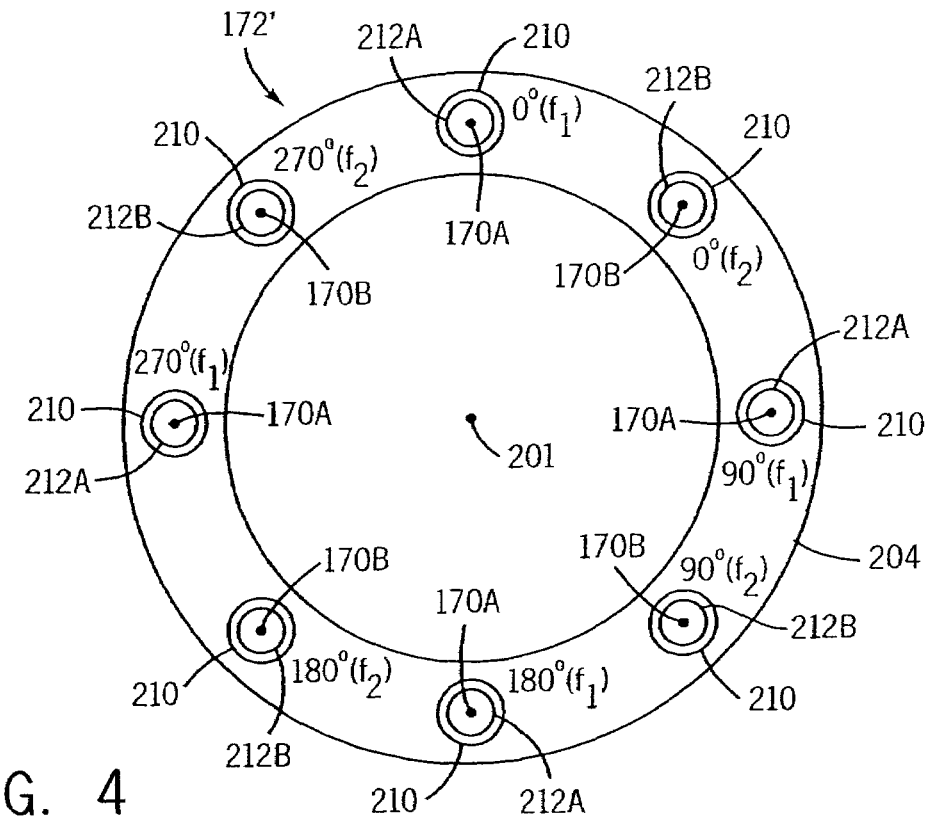
FIG. 4 is a pictorial representation of an end view of the RF resonator of FIG. 7.

The RF coil assembly 155 is shown generally in FIGS. 3 and 4 and it includes two separate channels $f_1$ and $f_2$ which connect to the respective transceivers 80 and 82. Before describing this multinuclear embodiment of the coil assembly 155, a more detailed description of each channel $f_1$ or $f_2$ will be made first with reference to FIGS. 5 and 6.

Figure 5:
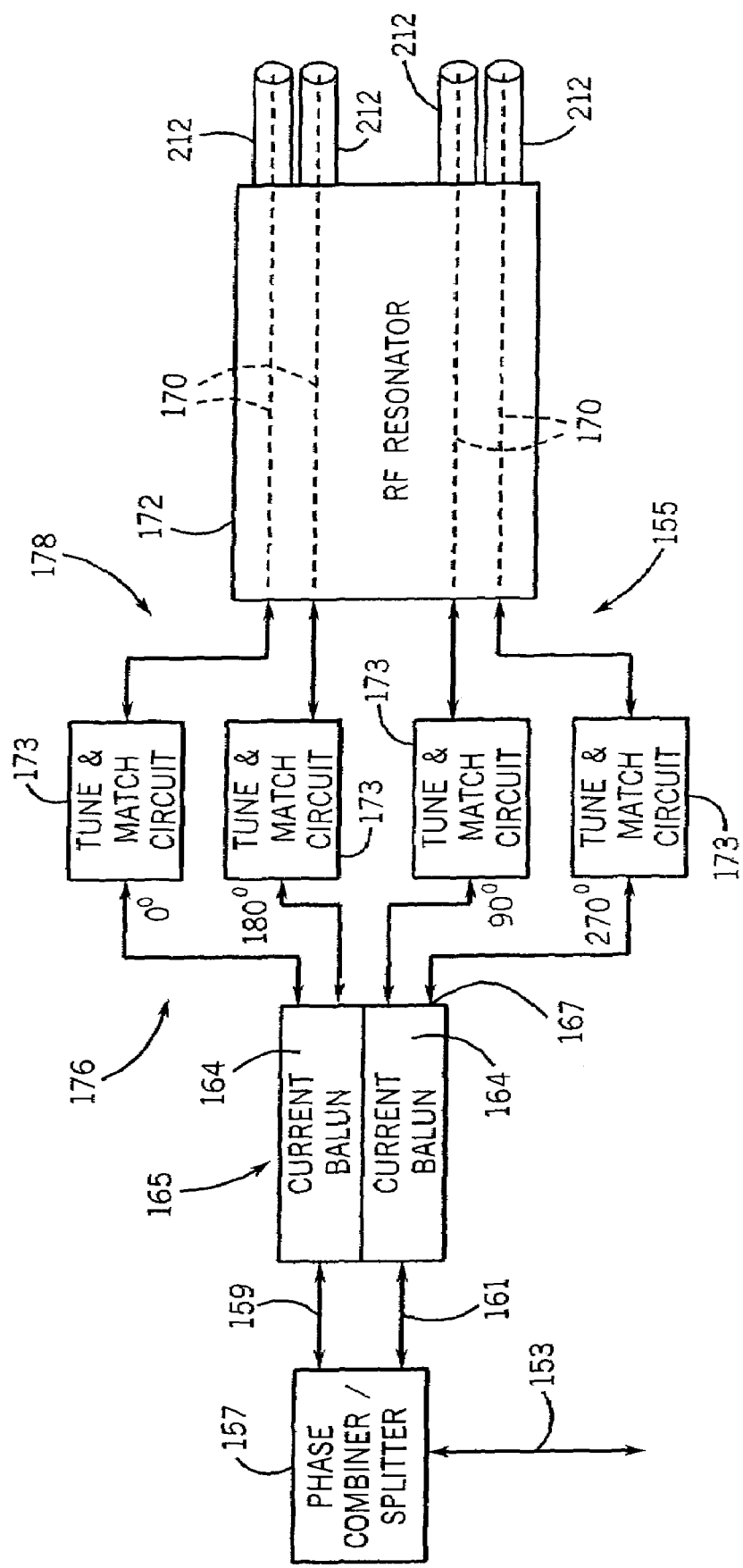
FIG. 5 is a block diagram of the drive circuitry for one of the two Larmor frequencies in the assembly of FIG. 3.
Figure 6:
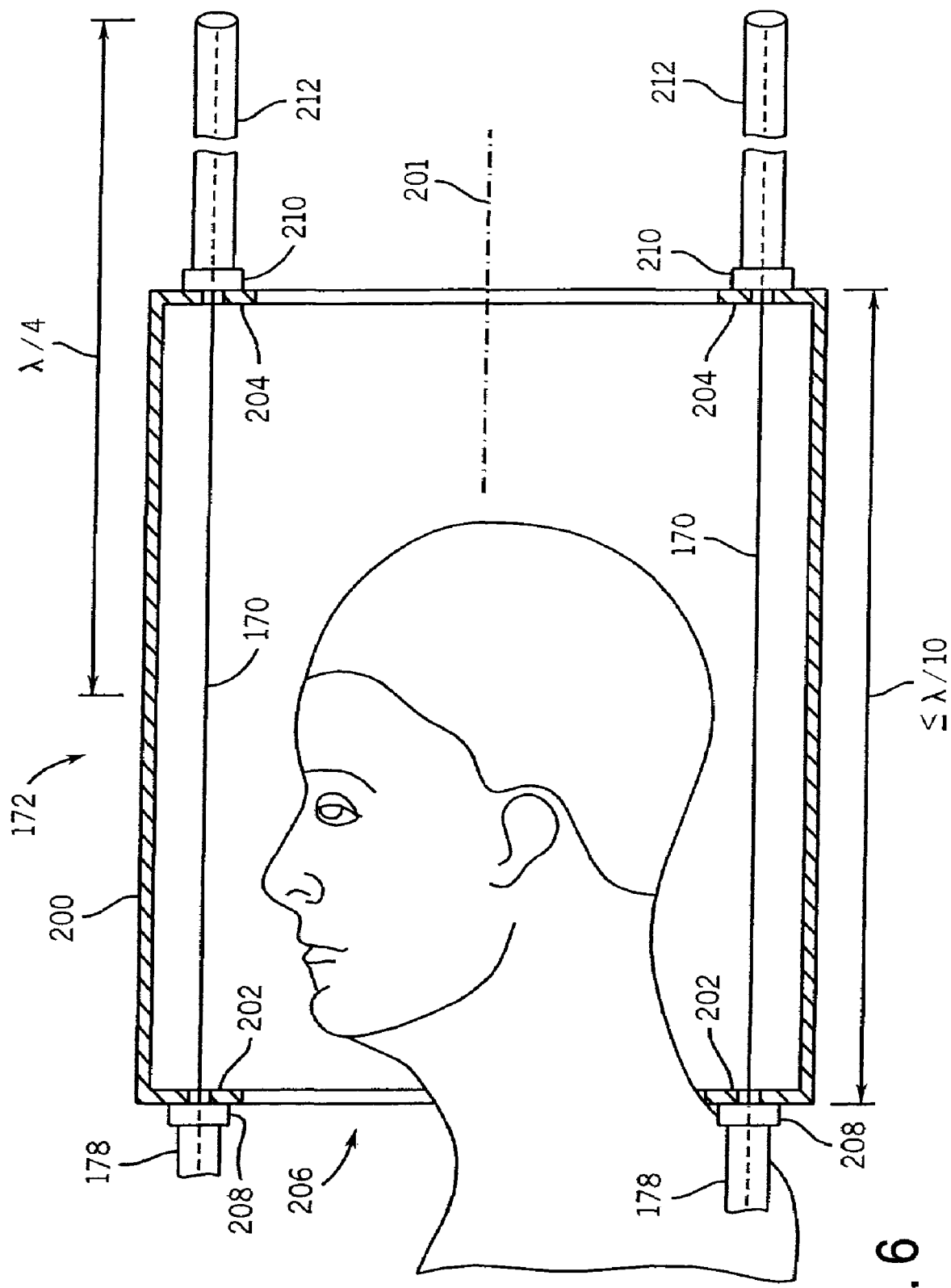
FIG. 6 is a pictorial representation of a first preferred application of the RF resonator for head and brain imaging that forms part of the coil assembly of FIG. 3.

Referring to FIGS. 5 and 6, each channel $f_1$ and $f_2$ in the coil assembly 155 includes a phase combiner/splitter 157, current balun pairs 165, tune and match circuits 173, an RF resonator or coil 172, and terminal susceptance elements such as coaxial termination stubs 212. The resonator 172 includes a plurality of conductive legs 170 within a cylindrical shield 200. In brief, pairs of conductive legs 170 operate as balanced transmission lines terminated by terminal susceptance elements such as coaxial stubs 212 and standing waves are established on each conductive leg 170 within the cylindrical shield by proper selection of the terminal susceptance elements. Preferably, the resonator 172 operates with quadrature phasing on both transmit and receive which is provided by the circuit 157 and current balun pair 165.

The phase combiner/splitter 157 connects to the coaxial line 153 from the transceiver and produces two equal RF currents on preferably 50 ohm coaxial lines 159 and 161 which differ in phase by 90°. In its simplest form the phase combiner/splitter 157 is a 50 ohm T connector with the common connection made to line 153 and each of the T arms connected to one of the lines 159 or 161 through a matched transmission line. One of the transmission line sections is one quarter wavelength longer than the other section to impart a 90° phase difference between currents on lines 159 and 161. With this particular embodiment, the circuit 157 must be tuned to the particular Larmor frequency being employed. In the alternative, other circuits are well known in the art which can split an RF signal applied through line 153 to quadrature RF signals that are produced on lines 159 and 161, or which can combine quadrature signals applied through lines 159 and 161 into a single combined RF signal on line 153. Phase combiner/splitter circuits that can operate at many frequencies are described, for example, in U.S. Pat. No. 5,296,814 and U.S. Pat. No. 7,019,527 which are incorporated herein by reference.

A current balun pair 165 is provided with each balun individually driven by a respective quadrature signal on line 159 or line 161. While in most cases it is desirable that the quadrature signals on lines 159 and 161 be exactly 90° out of phase with each other, there are instances when adjustments away from exact quadrature are desirable. This can easily be achieved using different lengths of matched transmission line segments, or by using digital phase control.

The I and Q quadrature RF signals on coaxial cable lines 159 and 161 are each coupled to a balanced load by a respective current balun 164 of current balun pair 165. As is well known in the art, a coaxial cable is an unbalanced feedline and currents can flow on the outer surface of its shield which cause an unbalanced current flow. As will be described below, the balanced load in this embodiment can be viewed as a ½ wave dipole and the purpose of each balun 164 is to insure that the current flow in one arm of the dipole is always substantially equal and opposite to the current flow in the contralateral dipole arm. A balun that fulfills this objective is a "current" balun that maintains the balanced currents in the dipole arms even though the impedances of the two dipole arms may be different. The current balun is important in this application because in MRI it is the current, not the voltage that produces the magnetic field and it is the magnetic field rather than the electric field that is important. Also, whereas the dipole can be constructed with symmetric loads on each dipole arm, in this case the dipole arms are part of a resonator structure described below that receives a subject to be examined. When placed in the resonator, the subject loading often becomes unequal on the two dipole arms. By using the current balun 164, current balance is maintained despite such asymmetric loading and the homogeneity of the RF magnetic field in the resonator is maintained. The balanced, phase conjugate current flow at the output of the current balun is important for proper operation of the RF resonator 172. In a preferred embodiment, the common mode rejection of the current balun 164 should be sufficient to closely match the currents in each conductive arm of a conjugate pair. Current baluns are well known devices and preferred embodiments are described in detail in FIGS. 4a-c of the above-cited parent application.

Referring again to FIG. 5, each of the four resonator-side connectors on the current balun pair 165 is connected to a respective conductive leg 170 in the resonator 172 through a respective tune and match circuit 173. A feedline such as coaxial cable 176 is used to connect a balun terminal 167 to its respective tune and match circuit 173. Similarly, feedlines such as coaxial cables 178 are used to connect the tune and match circuits to the conductive legs 170 in the resonator 172.

Figure 7:
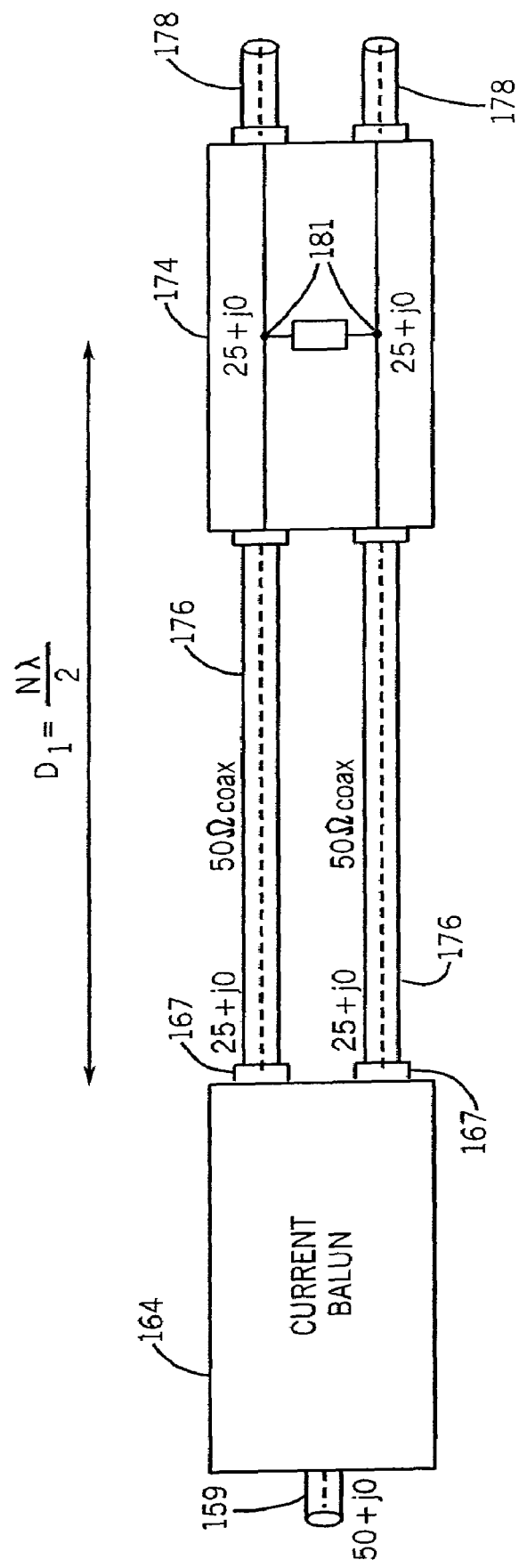
FIG. 7 is a pictorial representation of a tune and match circuit that forms part of the assembly of FIG. 3.

As shown more particularly in FIG. 7, one embodiment of the tune and match circuit 173 receives coaxial cables 176 at a characteristic impedance of 50 ohms. The two pieces of coaxial cable 176 extending from a current balun 164 together form a balanced, shielded line that connects conductive housing or box 174. The coaxial cables 178 extending from tune and match circuit pair housing 174 also have a characteristic impedance of 50 ohms and each has a length selected to present in combination with the tune and match circuit 173 a purely resistive load of 25 ohms at respective match points 181. Each tune and match circuit operates to null the susceptance component of the admittance at match point 181 (equivalent to nulling the reactive component of the impedance at this point). This purely resistive load of 25 ohms is also desired at output terminals 167 of the current balun 164, and can be achieved by properly selecting the lengths of the pieces of coaxial cable 176. In particular, the 25 ohm resistance of the resonator as seen at match point 181 repeats at each of the two terminals 167 on the balanced end of the balun provided that the two lengths of 50 ohm coaxial cable 176 forming the balanced line are approximately λ/2 in length (where λ corresponds to a desired Larmor frequency) or some integral multiple thereof. Since loads across the output side of the balun are in series, the two 25+j0 impedances at output terminals 167 add to 50+j0, which is seen looking into the input terminal (unbalanced port) of each balun 164.

Referring particularly to FIG. 6, the first preferred embodiment of the resonator 172 is in the form of a local coil, or head coil. It includes a circular cylindrical shield 200 which extends radially inward toward a central axis 201 at each of its ends to form respective annular shaped mounting rings 202 and 204. The shield 200 includes an insulating supporting substrate such as a Lucite™ tube and a double foil Faraday copper shield on opposing surfaces of the substrate as described in U.S. Pat. No. 5,680,046 which is incorporated herein by reference. The mounting rings can also be formed from Lucite™ material or other suitable insulating material. In this embodiment the shield 200 is sized to receive the head of a subject to be examined in a circular opening 206 defined by the inner edge of the mounting ring 202.

The mounting ring 202 provides a surface to which four connectors 208 may be attached for receiving the cables 178 from the drive circuitry described above. Note that the mounting rings 202 and 204 are not required, and in other embodiments a portion or all the connectors can be provided on the shield 200 such that the feed lines form right angles with the conductive legs and/or the terminal susceptance elements form right angles with the conductive legs. As will be described in more detail below, the connectors are preferably equally spaced about the circumference of the mounting ring 202 and symmetry is maintained. The shield on each cable 178 connects to the resonator shield 200 and its center conductor passes through an opening in the mounting ring 202 and connects to one end of a conductive leg 170. In essence, the resonator shield 200 is an extension of the cable shield which is expanded radially to receive the subject to be examined.

The multiple conductive legs 170 extend through the cavity defined by the shield 200 parallel to a central axis 201 and attach to corresponding connectors 210 attached to the mounting ring 204 at the opposite end of the resonator 172.

The conductive legs 170 are constructed of a very low resistance material which is formed very thin to avoid eddy currents induced by changing gradient coil fields. Highly polished copper or polished silvered copper is preferred and the legs are shaped as tubes or ribbons to provide mechanical rigidity. For example, conductive copper tape placed over a cylindrical form of Lucite™, polyethylene, or other suitable material offers a convenient and economical way to form an array of conductive legs. Each conductive leg 170 is spaced radially inward from the cylindrical or Faraday shield 200. The distance of each conductive leg 170 from the adjacent Faraday shield 200 is adjusted to optimize the homogeneity of the RF magnetic field within the resonator central cavity where the subject to be examined resides. The distance will be a function of the diameter of the resonator, but it is not a function of the resonant frequency to which the conductive leg 170 is tuned. Thus, the conductive legs 170 can be tuned to different Larmor frequencies with no mechanical changes within the resonator shield 200.

The connectors 210 at the back end of the resonator 172 support terminal impedance elements such as termination stubs connected in series with the conductive elements 212 (of coaxial cable) in such a manner that a homogeneous magnetic field is produced within the resonator cavity. Each terminal impedance element is chosen to give a current maximum and a voltage minimum at the midpoint of each conductive leg 170. In this embodiment, the conductive legs 170 and termination stubs 212 function as a continuous transmission line, albeit with a possible impedance discontinuity at the conductive element-stub electrical junction. We designate the characteristic differential impedance of conductive element conjugate pairs and termination stub pairs as $Z_0^{cond}$ and $Z_0^{stub}$ respectively. It should be noted that these impedances are complex quantities, wherein Z=R+jX. Thus, impedance is the vector sum of a resistive component R and a reactive component X.

To effect a virtual short at the midpoint of each conductive leg requires that the differential impedance of the stub pair, R+jX, be equal to that of an open circuit stub pair of length [¼λ–L/2] whose characteristic impedance $Z_0^{stub}$ is identical to $Z_0^{cond}$. The quality of this short depends on the Q of the stub 212: a high Q will effect a virtual short of very high conductance. A similar analysis holds for short circuited stubs. The short circuited termination stubs will perform best when the short circuits are made with high quality preferably silver solder joints, which should be polished and free of oxides for the highest possible RF conductance. It is also good practice to keep the conductive legs 170 polished and free of oxides.

If $Z_0^{cond} \neq Z_0^{stub}$, the effective differential impedance of the stub pair must be determined by normalizing the impedance of the stub with respect to $Z_0^{cond}$, the characteristic admittance of the conductive leg. In the case where $Z_0^{cond} > Z_0^{stub}$, the stub lengths required for a virtual short at each conductive leg midpoint will be shorter than those required in the case where $Z_0^{cond} = Z_0^{stub}$. This case offers practical advantage as shorter termination stubs are more compact.

One may measure $Z_0^{cond}$ from open circuit and short circuit impedance measurements of a conductive leg conjugate pair at a frequency where the length of the transmission line resonator body corresponds to an odd integral multiple of λ/8. This insures that both measurements will be of comparable magnitude, and won't be near the extremes of an instrument's range. From these measurements, an excellent estimate of $Z_0^{cond}$ can be obtained from the equation:

$$Z_0^{cond} = \sqrt{Z_{sc}^{cond} \times Z_{oc}^{cond}}$$

The desired virtual short at conductive leg midpoints may be verified by looking into the input terminal of a current balun whose output terminals are connected to both legs of a conjugate pair of the resonator. If the distance between balun input and resonator leg midpoints is λ/2 or an integral multiple thereof, a short circuit will be seen if the normalized impedance of the stub is correct. It should be noted that no pair of capacitors can substitute for a transmission line stub pair connected in series with a conductive element conjugate pair. Matched capacitve L networks might substitute for stubs, but the shunt capacitor of each L network would have to be extremely small to emulate a good open circuit. Such L networks would be vulnerable to the effects of stray reactance. Thus, transmission line stubs are the preferred embodiment of terminal impedance elements.

Figure 8:
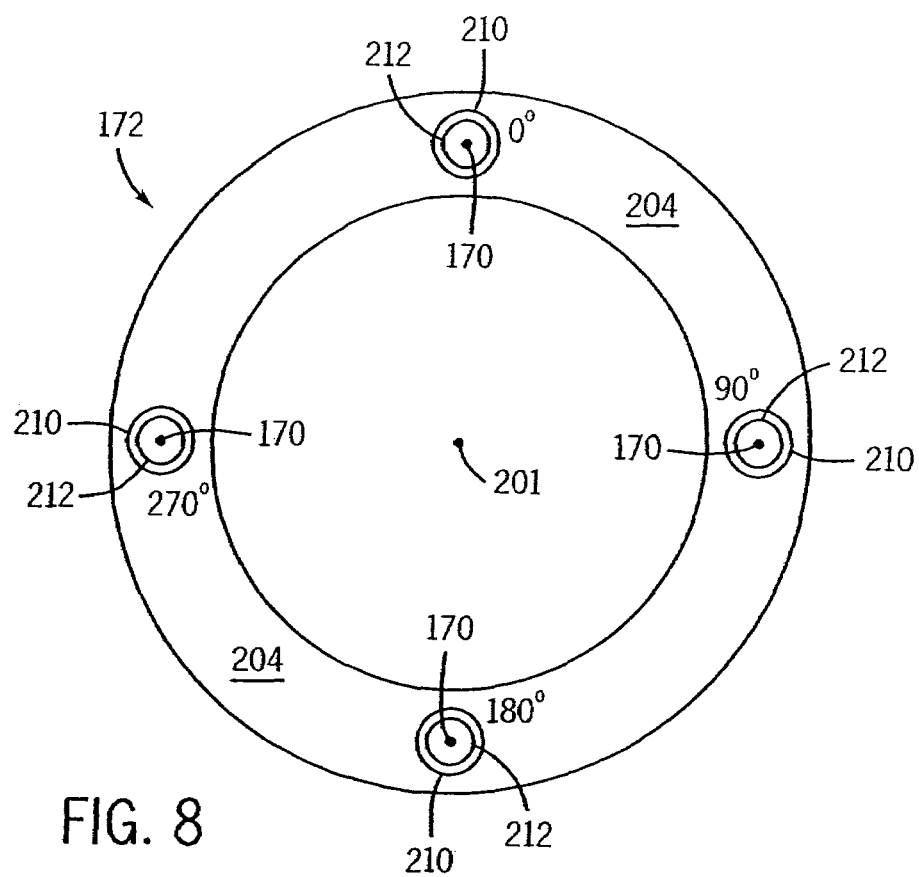
FIG. 8 is a pictorial end view of the conductive legs driven at one Larmor frequency by the drive circuitry of FIG. 5.

As shown in FIG. 8, the four conductive legs 170 for one frequency channel are spaced evenly around the circumference of the resonator 172. The symmetry required to obtain a homogeneous RF magnetic field within this resonator demands that current flow be equal and opposite to each other on opposite sides of the central axis 201. This is achieved by symmetrically positioning pairs of opposing conductive legs around the central axis 201. In the four element resonator, one opposing pair of conductive legs 170 are positioned at 0° and 180°, and a second opposing pair are positioned at 90° and 270°. This is the geometric aspect of the required symmetry. An additional requirement is that the opposing conductive elements conduct equal, but opposite currents. More conductive legs 170 and associated drive circuitry can be added to improve field homogeneity, but in all cases they must be arranged to maintain the above symmetry.

Figure 9:
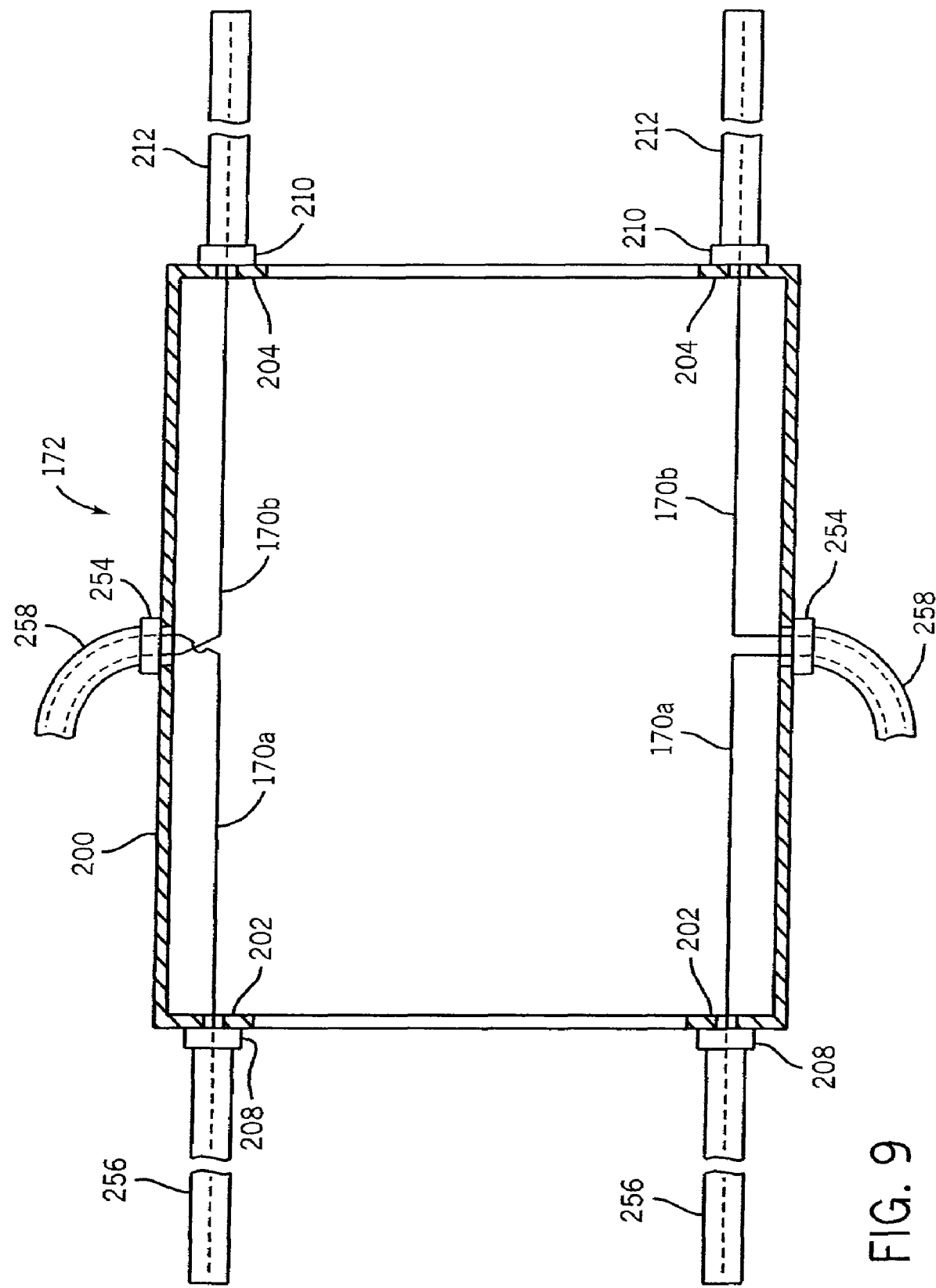
FIG. 9 is pictorial representation of a second preferred RF resonator for body imaging applications that forms part of the coil assembly of FIG. 3.

Another embodiment of the RF resonator 172 that may be suitable for use as a whole-body RF coil 34 is shown in FIG. 9. The shield 200 and mounting rings 202 and 204 are essentially the same as described above, except they are scaled up in size. To maintain a desired homogeneous RF magnetic field over a larger volume, the conductive legs 170 are divided into two equal leg segments 170a and 170b and driven from a midpoint rather than the front end of the resonator. More particularly, a front conductive leg segment 170a connects at a midpoint connector 254 and extends forward through the connector 208 into a termination stub 256. Similarly, a rear conductive leg segment 170b connects at the midpoint connector 254 and extends rearward through connector 210 and into the termination stub 212. The termination stubs 256 and 212 are identical and they are tuned as described above to produce maximum current and minimum voltage at the midpoint of the resonator at a Larmor frequency of choice.

Figure 10:
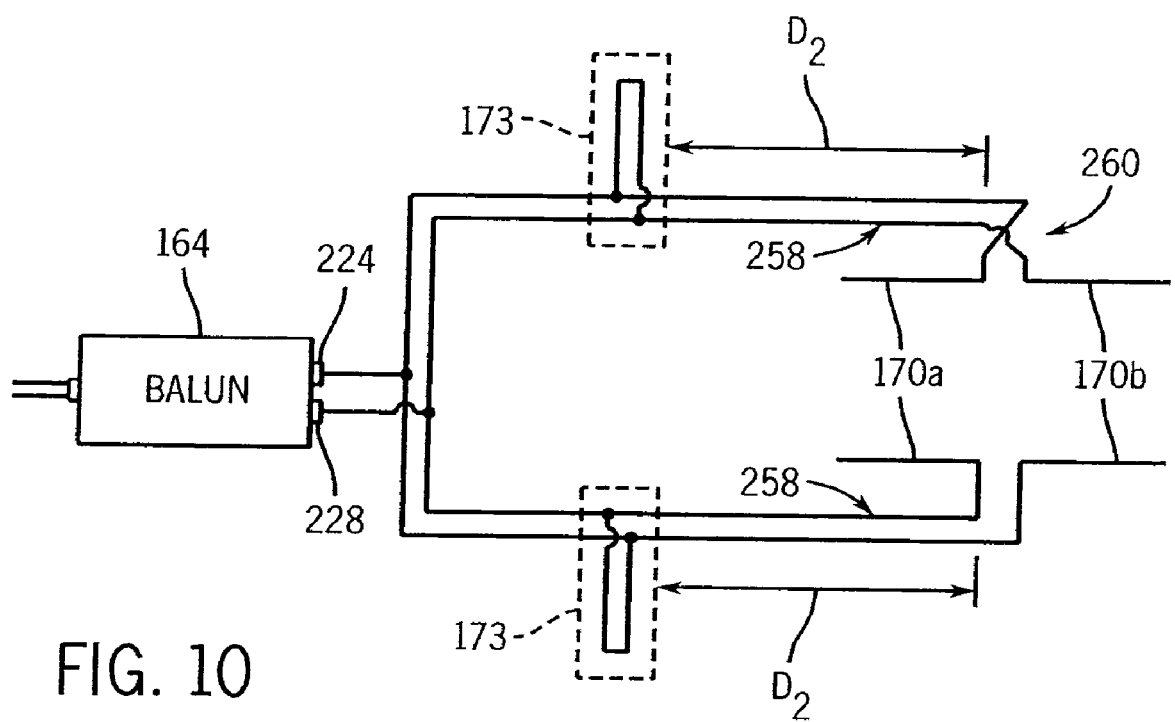
FIG. 10 is a schematic representation of the changes required to drive the RF resonator of FIG. 9.

The conductive leg segments 170a and 170b connect to the conductors in a twin-lead, low impedance cable 258 that terminates at the midpoint connector 254. As shown in FIG. 10, the twin lead cables 258 extend a distance D to a respective tune and match circuit 173 and the two leads therein extend to and connect to the two phase conjugate connectors 224 and 228 on the balun 164. Each conductive leg segment pair 170a and 170b forms a dipole antenna and to maintain the symmetry described above that is required for a homogeneous magnetic field, the leads to one of the two dipole antennas are switched as indicated at 260 to change its phase 180° with respect to the opposing dipole antenna.

In the first embodiment of the resonator 172 described above there exists a virtual short circuit at the midpoint of each conductive leg 170. This virtual short point is a voltage node where the electric field is very small and dielectric losses are minimal. The current distribution along the length of each conductive leg 170 is peak at its midpoint and drops off sinusoidally as a function of distance from this midpoint and the wavelength (λ) corresponding to the Larmor frequency. This drop-off condition requires that the axial length of the resonator 172 be limited to less than λ/10 in order to maintain homogeneous magnetic fields and keep electric field magnitudes acceptably low. This is not a problem when the resonator is used at lower polarizing fields (i.e. longer Larmor frequency wavelength) or the resonator is a relatively small local coil.

The embodiment of the resonator 172 illustrated in FIG. 9 relieves this constraint by a factor of two. By driving each conductive leg 170 at its midpoint rather than one end, the length of the resonator is limited to λ/5 rather than λ/10. This results because the end of each conductor at the feed point is precisely ¼ wavelength away from the open circuit stub end, or is an odd integral multiple thereof. Alternatively, if this stub end is short circuited, the wavelength is n*λ/4, where n is an even integer.

The coil assembly 155 in FIG. 2 can be used to perform multinuclear NMR measurements simultaneously. This is achieved by tuning selected pairs of the conductive legs 170 to the Larmor frequency of one spin species and tuning the Larmor frequency of the remaining conductive legs 170 to another spin species. For example, one Larmor frequency may be that of hydrogen protons and the other Larmor frequency may be that of $^3$He, $^{13}$C, or $^{23}$Na.

Referring particularly to FIGS. 3 and 4, the multinuclear coil assembly 155 for driving both frequency channels includes an eight-element RF double resonator 172'. The $f_1$ transceiver 80 couples to one set of drive circuitry indicated at 300 and the other transceiver 82 couples to a second set of drive circuitry indicated at 302. The drive circuits 300 and 302 are identical to those described above with respective phase combiner/splitters 157A, 157B, current balun pairs 165A, 165B and tune and match circuit's pairs 174A, 174B. For drive circuitry 300, the distance $D_1$ between the tune and match circuit pair 174A and the RF double resonator 172' is adjusted to the length needed for the wavelength $\lambda_1$ corresponding to the Larmor frequency $f_1$, in the same manner described above. Further, the four coaxial stubs 212A for the leg segments 170A driven by the $f_1$ channel are also adjusted in length. The $f_1$ tune and match circuit pair 174A will also be set to null any reactive component at this frequency as described above. Similarly, corresponding adjustments are made for corresponding distance $D_2$, length of coaxial stubs 212B, tune and match circuit pair 174B in the $f_2$ channel such that they are tuned to the wavelength $\lambda_2$ corresponding to the second Larmor frequency $f_2$.

As shown in FIG. 4, the four conductive legs 170A driven by the $f_1$ channel are positioned at the physical angles 0°, 90°, 180° and 270° around the circumference of the double resonator 172' and as described above, their associated coaxial stubs 212A are set to the $\lambda_1$ wavelength. The remaining four conductive legs 170B at physical angles 45°, 135°, 225° and 315° are driven by the $f_2$ channel and their associated coaxial stubs 212B are set to the $\lambda_2$ wavelength.

Thus the drive circuitry for the $f_1$ conductive legs 170A and the $f_2$ conductive legs 170B operate exactly as described above for a coil assembly operating at a single Larmor frequency. More specifically, the quadrature rotating field for each frequency $f_1$ and $f_2$ is supported by pairs of opposing conductive legs 170A, 170B oriented 90° with respect to one another. The conductive legs 170A are interspersed with the conductive legs 170B around the mounting ring 204 at 45° increments with respect to one another shown in FIG. 4 without changing the pattern of their excitation. Note that the electrical phase increments will be the same for both the $f_1$ coil and the $f_2$ coil, namely 0°, 90°, 180°, 270°. This arrangement would normally be problematic due to the magnetic coupling between adjacent conductive legs 170A, 170B at respective frequencies $f_1$ and $f_2$ and a severe distortion of the $B_1$ RF field at each frequency would result for both transmit and receive.

Fortunately, nature presents a solution to this coupling problem for some combinations of NMR active nuclei that enables them to be used together. It may be seen that the ratio of the gyromagnetic ratios of $^3$He and $^1$H (proton) are approximately 0.762 as determined by accurate experiment. This ratio is very close to ¾, and allows for excellent decoupling between the two resonators as will be described below. It may also be seen that the ratio of the $^{13}$C and $^1$H gyromagnetic ratios is very close to ¼; this permits the construction of dual frequency $^{13}$C-$^1$H resonators with excellent mutual isolation between the two. This approach may also be used for $^{23}$Na and $^1$H.

Figure 11:
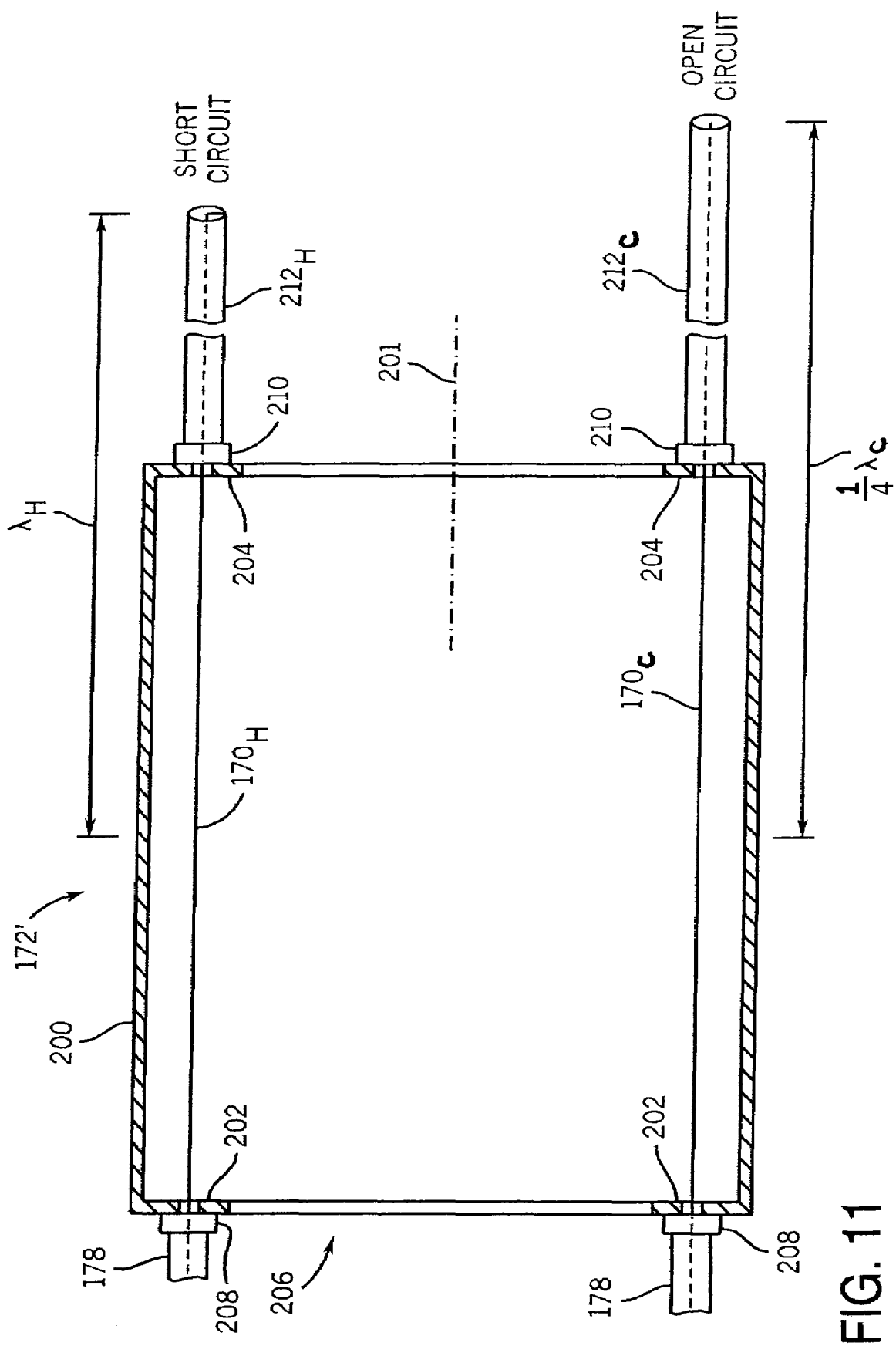
FIG. 11 is a pictorial view of the RF resonator that forms part of the assembly of FIG. 3.

Referring particularly to FIG. 11, the double frequency resonator 172' is shown with two pairs of conductive legs, one pair $170_H$ tuned to the Larmor frequency of $^1$H and the other pair $170_C$ tuned to the Larmor frequency of $^{13}$C. The coaxial stub $212_H$ on the hydrogen conductive leg $170_H$ is set to produce a current maximum at its midpoint as described above. This can be achieved with a shorted stub and a distance between the shorted end of the stub and the midpoint of conductive legs approximately equal to one wavelength $\lambda_H$. This length is chosen because at the Larmor frequency of $^{13}$C, this length produces a current minimum for $^1$H nuclei at the same midpoint. Similarly, the coaxial stub $212_C$ for the $^{13}$C conductive leg $170_C$ is set to produce a current maximum at the midpoint of the conductive leg $170_C$. This can be achieved with an open stub and a distance between the open end of the stub on the midpoint of the conductive leg approximately equal to a length of ¼$\lambda_C$. This length produces a current minimum at the same approximate midpoint for signals at the hydrogen Larmor frequency. A high degree of isolation will be realized because each resonator acts as a stop band filter for the other. This may be understood by considering the load seen by a conductive leg $170_C$ if it were to couple with a neighboring conductive leg $170_H$: the coaxial stub $212_H$ inverts a short at the $^{13}$C frequency, so a very high load is seen by the conductive leg $170_H$ and coupling is minimized. Similarly, a conductive leg $170_H$ sees a very high impedance on neighboring conductive leg $170_C$.

This illustrates why termination stubs are used as terminal impedance elements in the double nuclear coil: unlike a capacitor, a stub can "switch" from inductive (+) reactance to capactive (−) reactance with a change in frequency. In this case, a change in frequency approximates a complex inversion of the stub's susceptance at the generator end of the stub. In other words, the stub goes from Z to approximately (−1/Z). Briefly, the best isolation comes when the conductive leg is a near short at its Larmor frequency and a near open circuit at the other Larmor frequency. This means that the respective impedances measured at the midpoint of the conductive leg at the two Larmor frequencies will be as far apart as possible on the real axis of the Smith Chart.

Thus, by judiciously tuning the conductive legs 170 they can be rendered sensitive to signals at only one of the two Larmor frequencies being used. Table 2 is a list of possible combinations and the tuning of the stubs.

TABLE 2

Multiple Frequency Coil Table

| $^3$He/$^1$H Dual Coil | ¾ wave OC stubs for $^3$He and one wave SC stubs for $^1$H |
|---|---|
| $^{13}$C/$^1$H Dual Coil | ¼ wave OC stubs for $^{13}$C and one wave SC stubs for $^1$H |
| $^{23}$Na/$^1$H Dual Coil | ¼ wave OC stubs for $^{23}$Na and one wave SC stubs for $^1$H |

OC = open circuit
SC = short circuit

To practice the present invention the MRI system operates under the direction of a pulse sequence that directs the operation of the two drive circuits in the above-described coil assembly. Referring particularly to FIG. 12, the $^1$H spins are excited at their Larmor frequency by a series of rf pulses indicated generally at 300, and the $^{13}$C spins are excited at their Larmor frequency by a series of rf pulses indicated generally at 302. Several polarization (magnetization) transfer pulse sequences have been developed using the Nuclear Overhauser Effect (NOE) and are known in the art by acronyms including DEPT, INEPT, reverse INEPT described in detail by Morris and Freeman, *Journal of the American Chemical Society*, 1979; 101:760-762; Farrar '*Introduction to Pulse NMR Spectroscopy*' 1997 The Farragut Press Madison, Wis.; Harris '*Nuclear Magnetic Resonance Spectroscopy A Phisiochemical View*' 1983 Pitman Publishing, Marshfield, Mass.; Sohar '*CRC: Nuclear Magnetic Resonance Spectroscopy Volume 1*' 1983 CRC Press Inc, Boca Raton, Fla.; Goldman 'Quantum Description of High-Resolution NMR in Liquids' 1988 Oxford University Press Inc, New York. Doddrell D M, J Magn Reson 48:323-327. The series of rf pulses 300 are applied through one drive circuit to produce balanced currents in opposing conductive legs tuned to $^1$H and the series of rf pulses 302 are applied through the other drive circuit to produce balanced currents in opposing conductive legs tuned to $^{13}$C. The abundant transverse $^1$H magnetization produced by a 90° rf pulse 304 is transferred to the $^{13}$C spin magnetization by the J-coupling, or Nuclear Overhauser Effect, which arises from the dipolar cross-relaxation between these two nuclei. The rf pulses 300 and 302 operate to produce the $^1$H transverse magnetization, to transfer the $^1$H magnetization to the $^{13}$C spin population and then tip that $^{13}$C magnetization back to the longitudinal axis. Thus, the rf pulses 300 and 302 serve as a preparatory pulse sequence that produces abundant $^{13}$C longitudinal magnetization for an imaging pulse sequence to follow. Although the rf pulses 300 and 302 are at different Larmor frequencies, the isolation of the $^{13}$C coil elements and the $^1$H coil elements insures optimal performance.

Depending on the application, various chemical shift imaging pulse sequences indicated at 306 are performed after the preparatory sequence. For hyperpolarized $^{13}$C applications, this can be a rapid imaging sequence such as a echo planar spectroscopic imaging (EPSI) sequence or the IDEAL method (Reeder J Magn Reson Imaging. 2007 March; 25(3): 644-52). This pulse sequence 306 is played out at the $^{13}$C Larmor frequency to read out an MR signal produced by the enhanced $^{13}$C magnetization. During the readout of the $^{13}$C MR signals, only the opposing conductive legs tuned to $^{13}$C are employed. They are employed to excite the enhanced $^{13}$C magnetization and then acquire the $^{13}$C MR signal that is produced during readout. In the preferred embodiment a chemical shift imaging sequence (Brown, Kincaid, and Ugurbil, 1982, PNAS 79:3523-36.) such as the PRESS, STEAM, EPSI or IDEAL sequences are employed to readout the $^{13}$C MR signal. The pulse sequence in FIG. 12 is repeated many times and the imaging gradients $G_z$, $G_x$, and $G_y$ are stepped through a sequence of values to spatially encode the acquired MR signals in the well-known manner. An image is then reconstructed from this acquired k-space data using an image reconstruction method appropriate with the selected imaging pulse sequence 306.

Specific advantages of the described invention for polarization transfer are the following. First, true simultaneous excitation can be performed to provide more efficient spin coupling and exchange. Second, the conductor sets tuned to $^1$H and $^{13}$C are sensitive to nearly identical volumes and therefore polarization or magnetization transfer is more efficient and consistent over the entire imaging volume. Third, decoupling experiments can be performed more efficiently again because of simultaneous $^1$H and $^{13}$C transmission and excitation. More efficient coupling at higher field strengths can also help mitigate SAR for these applications. Finally, the coil is fully compatible with conventional $^1$H MRI and can therefore obtain a spatially registered anatomic map to relate structure and function in spectroscopic imaging applications.

It is also possible to monitor polarization transfer experiments dynamically using this RF coil design. Such an embodiment would use the INEPT or DEPT pulse sequence combined with simultaneous $^1$H and $^{13}$C image readout. When using hyperpolarized $^1$H or $^{13}$C labelled compounds, there may be applications for dynamic imaging of metabolism in cancer and other diseases. Moreover, the short $T_1$ times of hyperpolarized $^1$H and $^{13}$C compounds would also result in instances where certain sites on a molecule may have longer $T_1$ relaxation times but be of less biological interest. In vivo transfer of this polarization to other sites of more biological interest on the molecule but with shorter $T_1$ times might be efficiently performed using the present invention. This makes hyperpolarized $^{13}$C imaging more practical in vivo.

The invention claimed is:

1. A magnetic resonance imaging (MRI) system for acquiring magnetic resonance data from one spin species using magnetization transfer from another spin species having a different Larmor frequency, the combination comprising:
    a resonator having a cylindrical shield formed around a central axis and having plurality of pairs of opposing conductive legs arranged symmetrically around the central axis with the pairs of opposing conductive legs being divided into a first set and a second set, each conductive leg extending from one end of the cylindrical shield to another end of the cylindrical shield;
    means for tuning each conductive leg in the first set to the Larmor frequency of the first spin species;
    means for tuning each conductive leg in the second set to the Larmor frequency of the second spin species;
    first drive circuitry connected to each pair of opposing conductive legs in the first set and being operable to establish substantially equal and opposite current flow in opposing conductive legs at the Larmor frequency of the first spin species;
    second drive circuitry connected to each pair of opposing conductive legs in the second set and being operable to establish substantially equal and opposite current flow in opposing conductive legs at the Larmor frequency of the second spin species; and
    means for directing the first drive circuit to excite the first spin species and thereby transfer magnetization to the second spin species and for directing the second drive circuit to excite the second spin species and acquire a magnetic resonance signal from the same.

2. The system as recited in claim 1, wherein the first and second means for tuning include termination stubs, each termination stub is connected to one end of a respective conductive leg in series.

3. The system as recited in claim 2, wherein each of the termination stubs for the first means for tuning has a length that combined with a half length of a respective conductive leg is approximately equal to $n_1\lambda_1/4$, where $\lambda_1$ is a wavelength corresponding to the first Larmor frequency, and $n_1$ is an odd integer if the termination stub is open circuited, and $n_1$ is an even integer if the termination stub is short circuited, and further wherein each of the termination stubs for the second means for tuning has a length that combined with a half length of a respective conductive leg is approximately equal to $n_2\lambda_2/4$, where $\lambda_2$ is a wavelength corresponding to the second Larmor frequency, and $n_2$ is an odd integer if the termination stub is open circuited, and $n_2$ is an even integer if the termination stub is short circuited.

4. The system as recited in claim 2, wherein each of the termination stubs for the first means for tuning are open circuited at a distal end thereof and each has a length that combined with a half length of a respective conductive leg is approximately equal to $n_1\lambda_1/4$, where $\lambda_1$ is a wavelength corresponding to the first Larmor frequency and $n_1$ is an odd integer, and further wherein each of the termination stubs for the second means for tuning are short circuited at a distal end thereof and each has a length that combined with a half length of a respective conductive leg is approximately equal to $\lambda_2$, where $\lambda_2$ is a wavelength corresponding to the second Larmor frequency.

5. The system as recited in claim 1 in which the first spin species is hydrogen ($^1$H) and the second spin species is carbon ($^{13}$C).

6. The MRI system as recited in claim 1 in which the means for directing the first and second drive circuits includes a pulse sequencer programmed to perform a prescribed pulse sequence.

7. The MRI system as recited in claim 6 in which the prescribed pulse sequence is a magnetization transverse type pulse sequence.

8. The MRI system as recited in claim 6 in which the prescribed pulse sequence is an INEPT pulse sequence and readout simultaneously acquires images of $^1$H and $^{13}$C nuclei.

9. The MRI system as recited in claim 1 in which the first spin species is hyperpolarized.

10. The MRI system as recited in claim 9 in which the hyperpolarized first spin species is $^{13}$C.

* * * * *